United States Patent
Jeong et al.

(10) Patent No.: US 8,330,178 B2
(45) Date of Patent: Dec. 11, 2012

(54) PACKAGE STRUCTURE AND PACKAGE PROCESS OF LIGHT EMITTING DIODE

(75) Inventors: Hyunsoo Jeong, Kyunggi-Do (KR);
Seongoo Lee, Kyunggi-Do (KR);
Ryungshik Park, Kyunggi-Do (KR);
Hyunil Lee, Kyunggi-Do (KR)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 296 days.

(21) Appl. No.: 12/777,510

(22) Filed: May 11, 2010

(65) Prior Publication Data
US 2011/0278609 A1    Nov. 17, 2011

(51) Int. Cl.
*H01L 33/00* (2010.01)

(52) U.S. Cl. ............... 257/98; 257/79; 257/82; 257/88; 257/99; 257/100; 438/20; 438/22; 438/26; 438/29; 438/34

(58) Field of Classification Search .................. None
See application file for complete search history.

(56) References Cited

U.S. PATENT DOCUMENTS

| | | | |
|---|---|---|---|
| 7,560,820 B2 * | 7/2009 | Amiotti et al. | 257/788 |
| 2007/0120135 A1 * | 5/2007 | Soules et al. | 257/98 |
| 2007/0125984 A1 * | 6/2007 | Tian et al. | 252/301.4 S |
| 2008/0217637 A1 | 9/2008 | Kim et al. | |
| 2009/0001869 A1 | 1/2009 | Tanimoto et al. | |
| 2010/0032691 A1 * | 2/2010 | Kim | 257/88 |

OTHER PUBLICATIONS

"First Office Action of China Counterpart Application", issued on Mar. 12, 2012, p. 1-p. 4.

* cited by examiner

*Primary Examiner* — Kyoung Lee
(74) *Attorney, Agent, or Firm* — J.C. Patents

(57) ABSTRACT

A light emitted diode (LED) package structure and an LED package process are provided. The LED package structure comprises a carrier, a spacer, at least one LED chip, a junction coating, a plurality of phosphor particles, and an encapsulant. The spacer is disposed on the carrier and provided with a reflective layer covering a top surface of the spacer. The LED chip is disposed on the reflective layer and electrically connected to the carrier. The junction coating is disposed over the spacer and covers the LED chip. The phosphor particles are distributed within the junction coating. The encapsulant is disposed on the carrier and encapsulates the LED chip, the spacer and the junction coating. Uniform light output and high illuminating efficiency can be obtained by the phosphor particles uniformly distributed in the junction coating. The junction coating is formed by package level dispensing process to reduce the fabrication cost.

20 Claims, 5 Drawing Sheets

PACKAGE STRUCTURE AND PACKAGE PROCESS OF LIGHT EMITTING DIODE

BACKGROUND OF THE INVENTION

1. Field of the Invention

The present invention generally relates to a structure and a fabricating method of a light source. More particularly, the present invention relates to a package structure and a package process of light emitting diode (LED).

2. Description of Related Art

Light emitting diodes (LEDs) have replaced fluorescent lamps and incandescent lamps in some fields, for example, lamps of scanners requiring for quick response, lamps of projection apparatus, backlight sources or front light sources of liquid crystal displays (LCDs), illumination for dashboards of automobiles, traffic lights, common illumination devices, etc. Compared with conventional lamps, the LEDs have absolute advantages, for example, small volume, long lifespan, low driving voltage/current, non-fragile, mercury free (no pollution), and good luminous efficiency (power saving).

FIG. 1 is a cross-sectional view showing a conventional white LED package structure. As shown in FIG. 1, in the conventional white LED package structure 100, an LED chip 110 is bonded to a bottom surface 122a of a cavity 122 of a carrier 120. A part of lights 152 emitted from the LED chip 110 is converted via phosphor particles 130 distributed in a resin 140, so as to output white lights 154. However, chromatic aberration (e.g. yellowish) occurs since the lengths of light paths (e.g. L1, L2) in the resin 140 corresponding to different emergence angles (e.g. θ1, θ2) from the LED chip 110 are varied. Accordingly, luminance of the white LED package structure 100 is reduced, and color of the light output is not uniform.

Besides, the prior art further provides another LED package structure having a phosphor coating layer formed by wafer level fabrication, wherein the phosphor coating layer conformally and fully covers the LED chip and the carrier so as to output a uniform white light. Nonetheless, the fabrication cost of the phosphor coating layer goes high due to performing a wafer level coating process.

SUMMARY OF THE INVENTION

Accordingly, the present invention is directed to an LED package structure capable of providing uniform light output and having high illuminating efficiency and low fabrication cost.

The present invention is directed to a package process for forming the aforementioned LED package structure.

As embodied and broadly described herein, the present invention provides an LED package structure comprising a carrier, a spacer, at least one LED chip, a junction coating, a plurality of phosphor particles, and an encapsulant. The spacer is disposed on the carrier and provided with a reflective layer covering a top surface of the spacer. The LED chip is disposed on the reflective layer and electrically connected to the carrier. The junction coating is disposed over the spacer and covers the LED chip. The phosphor particles are distributed within the junction coating. The encapsulant is disposed on the carrier and encapsulates the LED chip, the spacer and the junction coating.

The present invention further provides an LED package process comprising: attaching a spacer to a carrier, wherein the spacer is provided with a reflective layer covering a top surface of the spacer; disposing at least one LED chip on the reflective layer and electrically connecting the LED chip to the carrier; preparing a junction coating mixed with a plurality of phosphor particles; disposing the junction coating over the spacer, the junction coating covering the LED chip; and forming an encapsulant on the carrier, the encapsulant encapsulating the LED chip, the spacer and the junction coating.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
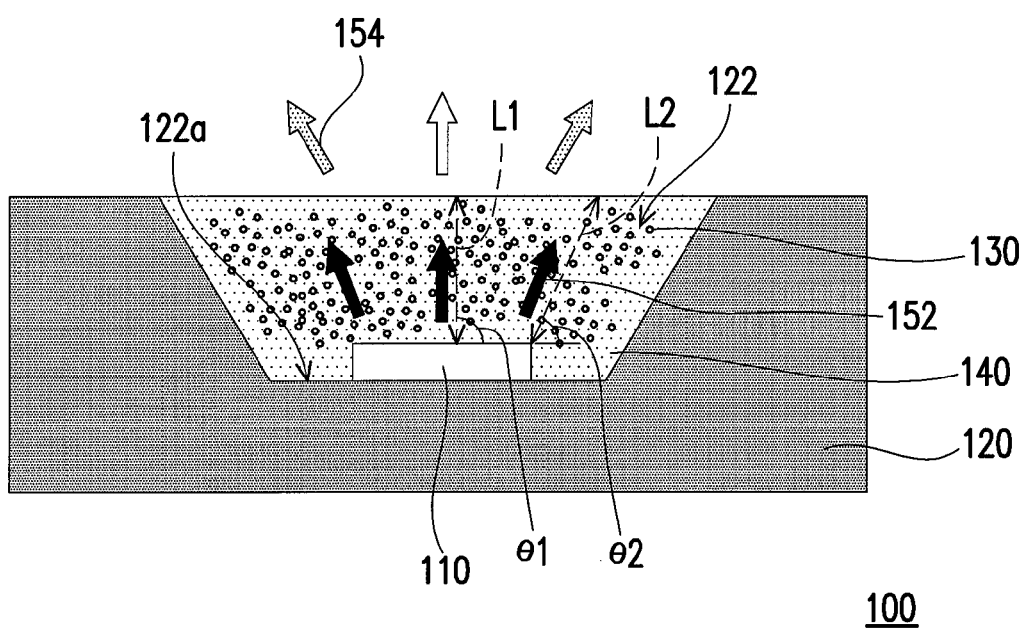
FIG. 1 is a cross-sectional view showing a conventional white LED package structure.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
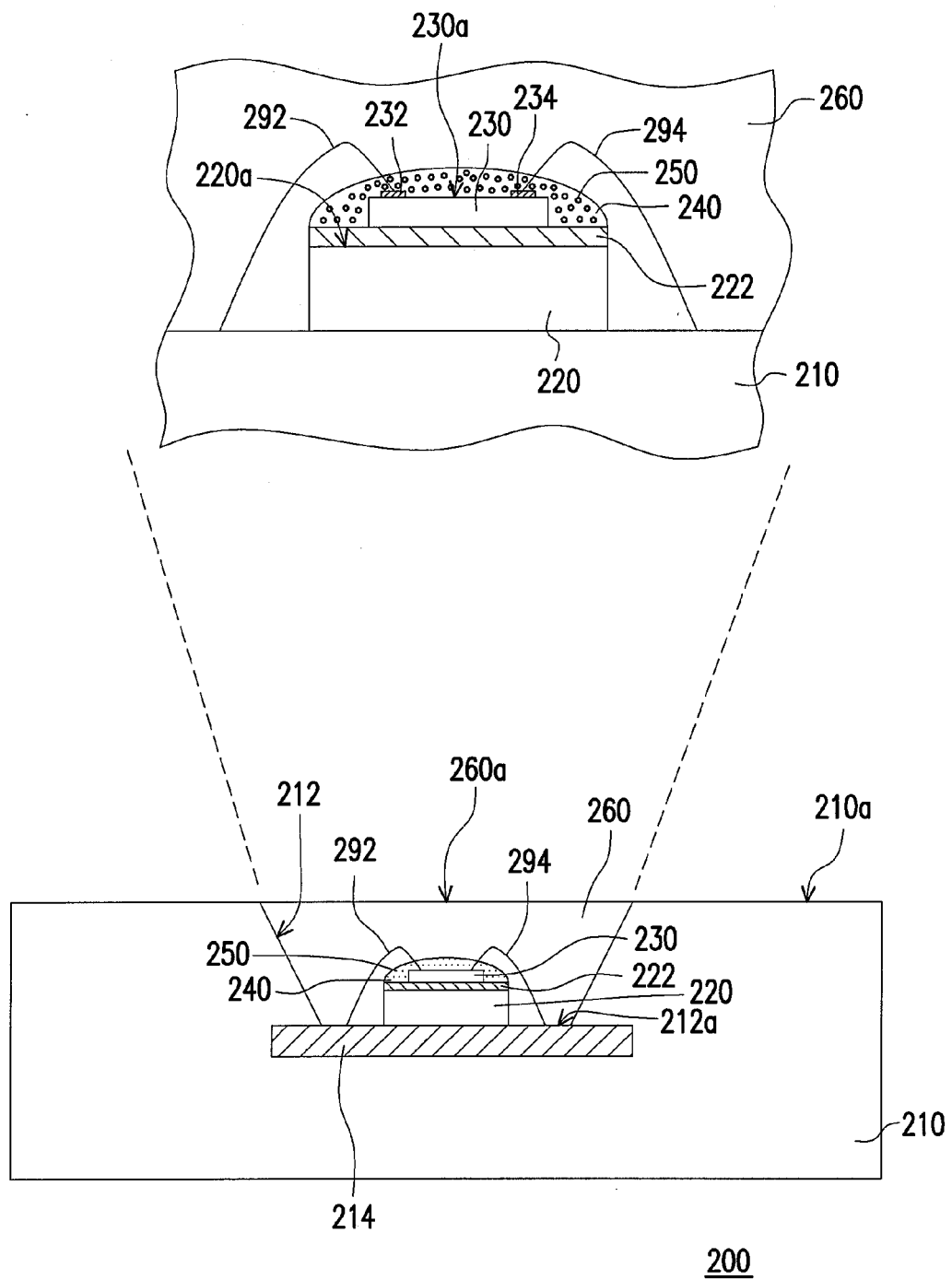
FIGS. 2A and 2B are cross-sectional views showing LED package structures according to an embodiment of the present invention.
Figure 2B:
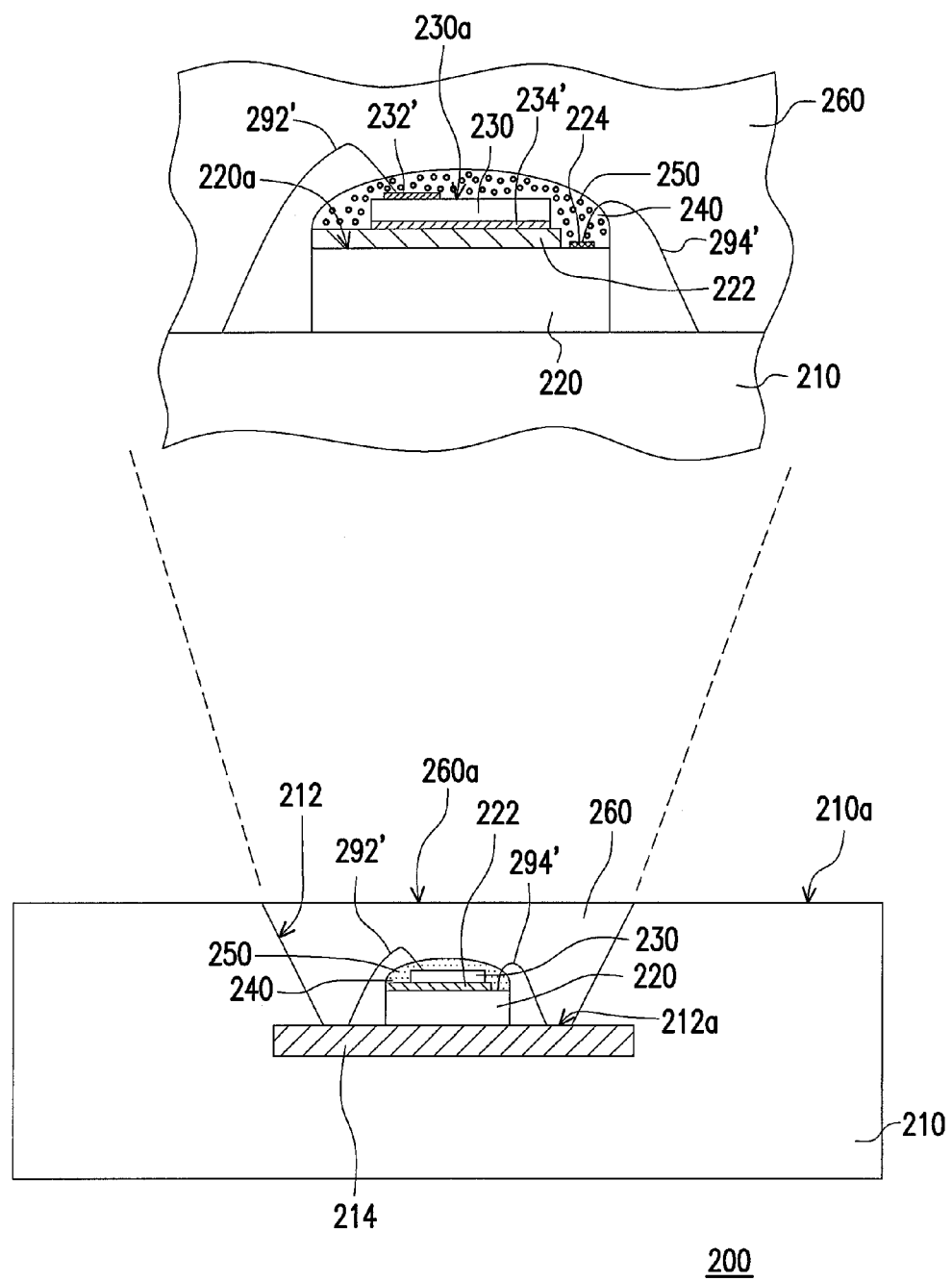

FIGS. 2A and 2B are cross-sectional views showing LED package structures according to an embodiment of the present invention. Referring to FIGS. 2A and 2B, the LED package structure 200 comprises a carrier 210, a spacer 220, at least one LED chip 230, a junction coating 240, a plurality of phosphor particles 250, and an encapsulant 260. In the present embodiment, the carrier 210 is, for example, a pre-molded metal leadframe having a cavity 212. A bonding pad 214 is exposed by the bottom surface 212a of the cavity 212. In other embodiments, the carrier 210 can further be, for example, a metal leadframe or a ceramic substrate, while the type of the carrier 210 of the present invention is not limited thereto.

The spacer 220 is disposed in the cavity 212 and attached to the bonding pad 214 of the carrier 210. In addition, the spacer 220 is provided with a reflective layer 222 covering a top surface 220a of the spacer 220. The reflective layer 222 is formed in the production of the spacer 220 by, for example, sputtering, plating, polishing the spacer 220 itself, or deposition by metal organic chemical vapor deposition (MOCVD) technique. Herein, the top surface 220a of the spacer 220 can be patterned or textured to enhance the light extraction efficiency of the LED package structure 200. In addition, the spacer 220 can be made of a conductive material, such as metal or metal alloy, etc; or, the spacer 220 can be made of a non-conductive material, including organic, inorganic material, such as ceramic, glass, silicon, epoxy, polycarbonate, PPA, poly ethylene, etc.

The LED chip 230 is disposed on the reflective layer 222 and electrically connected to the carrier 210. The spacer 220 can be made of a material having appropriate thermal conductivity, so as to provide the LED chip 230 with superior heat dissipation efficiency. Herein, the number of the LED chip 230 and the color of light emitted from the LED chip 230 are not limited. The reflective layer 222 can reflect the light emitted from the LED chip 230 to enhance light extraction efficiency of the LED package structure 200. In addition, dimensions of the LED chip 230 and the spacer 220 can further be regulated so as to obtain satisfying light extraction efficiency. Preferably, a size of the spacer 220 can be larger than 1.1 times the size of the LED chip 230 and smaller than 3 times the size of the LED chip 230.

The LED chip 230 can be bonded to the carrier 210 by wire bonding technique. Practically, the connecting manner between the LED chip 230 and the carrier 210 depends on the type of the LED chip 230. For example, as shown in FIG. 2A of the present embodiment, the LED chip 230 has a first electrode 232 and a second electrode 234 both disposed on a top surface 230a of the LED chip 230, while the first electrode 232 and the second electrode 234 are respectively electrically connected to the carrier 210 via a first bonding wire 292 and a second bonding wire 294. The top surface 220a of the spacer 220 is fully covered by the reflective layer 222.

However, as shown in FIG. 2B, the LED chip 230 may have a top electrode 232' electrically connected to the carrier 210 via a first bonding wire 292' and a bottom electrode 234' attached and electrically connected to the spacer 220 via the reflective layer 222. The reflective layer 222 may be patterned to expose at least one contact 224 of the spacer 220. The contact 224 of the spacer 220 is further electrically connected to the carrier 210 via a second bonding wire 294', so as to bridge the bottom electrode 234' to the carrier 210.

Referring to FIGS. 2A and 2B, the junction coating 240 is disposed over the spacer 220 and covers the LED chip 230. The top surface 240a of the junction coating 240 can be patterned or textured for enhancing light extraction efficiency of the LED package structure 200. The junction coating 240 can be made of transparent polymer or translucent polymer, such as soft gel, elastomer or resin, wherein the resin may be epoxy, silicone or epoxy-silicone hybrid resin. Furthermore, the junction coating 240 can be mixed with an organic filler or an inorganic filler. Herein, a material of the filler within the junction coating 240 can be selected from a group consisting of $SiO_2$, $TiO_2$, $Al_2O_3$, $Y_2O_3$, carbon black, sintered diamond powder, asbestos, glass, and a combination thereof.

The phosphor particles 250 are distributed within the junction coating 240. The junction coating 240 mixed with the phosphor particles 250 at least covers the LED chip 230 such that the light (e.g. blue light) emitted from the LED chip 230 can be converted to light in different color (e.g. green, yellow or red light) by the phosphor particles 250, and then the lights in different colors are mixed to generate a white light. Practically, the LED chip 230 can be fully covered by the junction coating 240 mixed with the phosphor particles 250 or not, depending on the light output direction of the LED chip 230. For example, if the LED chip 230 is an "thin GaN" LED chip which emits light mainly in top direction, the junction coating 240 mixed with the phosphor particles 250 covers at least the top surface 230a of the LED chip 230. Besides, if the LED chip 230 is an typical LED chip, so-called "epi-up" LED chip, which emits light in full direction, the junction coating 240 mixed with the phosphor particles 250 fully covers the LED chip 230, preferably, as shown in FIGS. 2A and 2B.

The phosphor particles 250 can be made of thermal-luminescent material or electro-luminescent material. More specifically, a material of the phosphor particles is elected from a group consisting of $(YGdTb)_3(AlGa)_5O_{12}$:Ce, $(SrBaCaMg)_2SiO_4$:Eu, $(Sr,Ba,CaMg)_3SiO_5$:Eu, $CaAlSiN_3$:Eu, $CaScO_4$:Ce, $Ca_{10}(PO_4)FCl$:SbMn, $M_5(PO_4)_3Cl$:Eu, $BaBg_2Al_{16}O_{27}$: Eu, Ba, $Mg_2Al_{16}O_{27}$:Eu, Mn, $3.5MgO.0.5MgF_2.GeO_2$:Mn, $Y_2O_2S$:Eu, $Mg_6As_2O_{11}$:Mn, $Sr_4Al_{14}O_{25}$:Eu, (Zn, Cd)S:Cu, $SrAl_2O_4$:Eu, $Ca_{10}(PO_4)_6ClBr$:Mn, Eu, $Zn_2GeO_4$:Mn, $Gd_2O_2S$:Eu, $La_2O_2S$:Eu, wherein M is an alkali earth metal selected from a group consisting of Sr, Ca, Ba, Mg, and a combination thereof.

The encapsulant 260 is disposed on the carrier 210 and encapsulates the LED chip 230, the spacer 220 and the junction coating 240. Herein, the encapsulant 260 can be made of transparent polymer or translucent polymer, such as soft gel, elastomer or resin, wherein the resin may be epoxy, silicone or epoxy-silicone hybrid resin. Furthermore, the encapsulant 260 may be mixed with an organic filler or an inorganic filler. A material of the filler within the encapsulant can be selected from a group consisting of $SiO_2$, $TiO_2$, $Al_2O_3$, $Y_2O_3$, carbon black, sintered diamond powder, asbestos, glass, and a combination thereof.

In the present embodiment, a pre-molded metal leadframe serving as the carrier 210 is adopted, so as to form the LED package structure 200, which is so-called a plastic leaded chip package carrier (PLCC) package structure. The cavity 212 of the carrier 210 is filled with the encapsulant 260, while a top surface 260a of the encapsulant 260 is coplanar with a top surface 210a of the carrier 210 surrounding the cavity 212.

Figure 3:
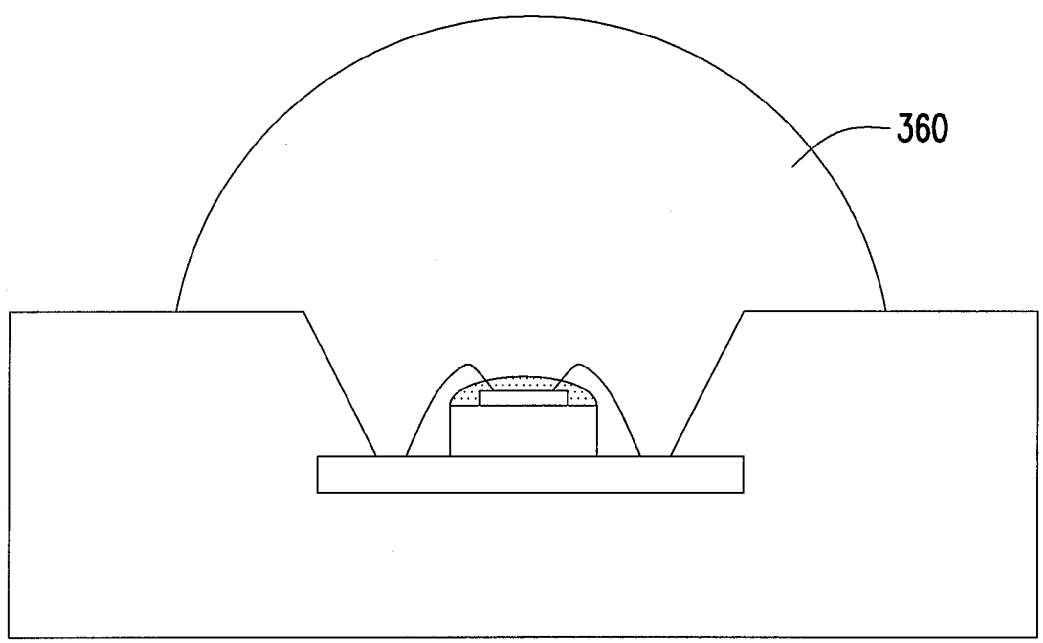
FIG. 3 is a cross-sectional view showing an LED package structure according to another embodiment of the present invention.
Figure 4:
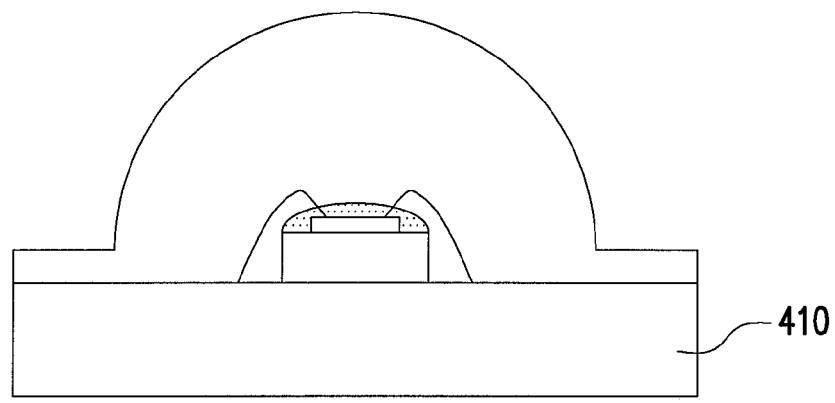
FIG. 4 is a cross-sectional view showing an LED package structure according to further another embodiment of the present invention.

However, various types of LED package structure are further proposed in other embodiments of the present invention by changing the profile of the encapsulant or adopting other types of carrier to form the LED package structure. FIG. 3 is a cross-sectional view showing an LED package structure according to another embodiment of the present invention. Referring to FIG. 3, the profile of the encapsulant 360 is in a convex lens shape so as to enhance light extraction efficiency of the LED package structure 300. FIG. 4 is a cross-sectional view showing an LED package structure according to further another embodiment of the present invention. As shown in FIG. 4, a ceramic substrate is adopted to serve as the carrier 410 and thereby forms the LED package structure 400.

Figure 5:
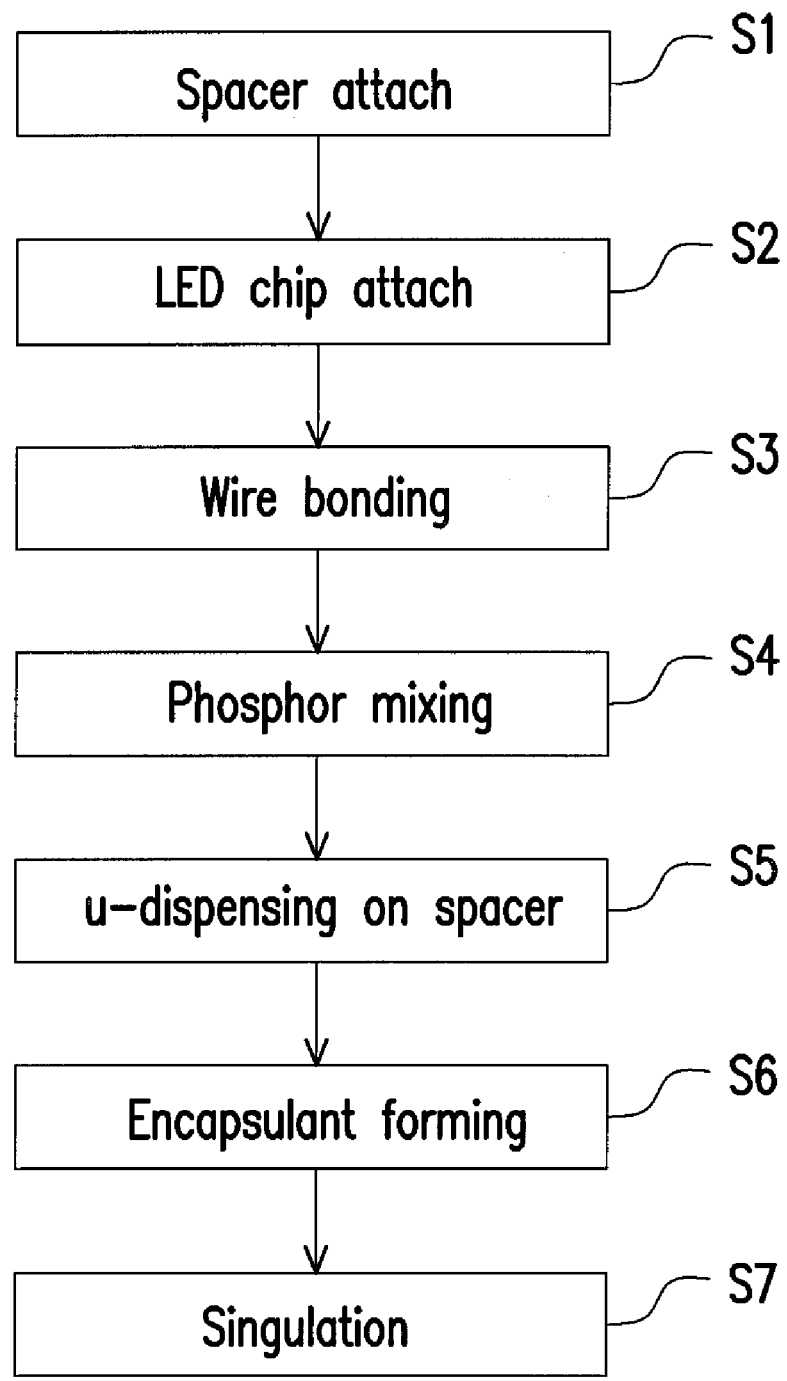
FIG. 5 is a flow chart illustrating an LED package process according to an embodiment of the present invention.

A package process for fabricating the aforementioned LED package structures is also provided in the present invention. FIG. 5 is a flow chart illustrating an LED package process according to an embodiment of the present invention. Referring to FIG. 5 accompanying with FIGS. 2A, 2B, 3, and 4, a wafer level package process is conducted to form a plurality of LED package structures (e.g. the aforementioned LED package structures 200, 300 or 400). Firstly, as illustrated in Step S1, a carrier strip comprising a plurality of carriers (e.g. the aforementioned carriers 210 or 410) in array is provided, and a spacer (e.g. the aforementioned spacer 220) is attached to each of the carriers (210, 410), wherein the spacer (220) is provided with a reflective layer (e.g. the aforementioned reflective layer 222) covering a top surface (220a) of the spacer (220). Then, referring to Steps S2 and S3, at least one LED chip (e.g. the aforementioned LED chip 230) is disposed on the reflective layer (222) of each of the spacers (220) and the LED chip (230) is electrically connected to the carrier (210, 410) by such as wire bonding technique. Next, Step S4 so called "Phosphor mixing" is performed to prepare a junction coating (e.g. the aforementioned junction coating 240) mixed with a plurality of phosphor particles (e.g. the aforementioned phosphor particles 250). Then, Step S5 so called "μ-dispensing on spacer" is performed to dispose the junction coating (240) over each of the spacers (220), wherein the junction coating (240) covers each of the LED chips (230). Next, referring to Step S6, an encapsulant (e.g. the aforementioned encapsulant 260 or 360) is formed on each of the carriers (210, 410) to encapsulate the LED chip (230), the spacer (220) and the junction coating (240). In Step S5, the encapsulant can be formed by dispensing to provide the encapsulant 260 as shown in FIGS. 2A and 2B or by molding to provide the encapsulant 360 in convex lens shape as shown in FIG. 3. Thereafter, referring to Step S7, a singulation process is performed to separate the carriers and the encapsulant to form the plurality of LED package structures (200, 300 or 400).

Based on the above, the LED package structure is provided with a spacer, wherein the junction coating mixed with the phosphor particles is dispensed over the spacer in package level process and covers the LED chip. Uniform light output and high illuminating efficiency can be obtained by the phosphor particles uniformly distributed in the junction coating. Besides, since the junction coating mixed with the phosphor particles is formed over the spacer by package level dispensing process rather than a wafer level coating process, the fabrication cost of the LED package structure can be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting diode (LED) package structure, comprising:
   a carrier;
   a spacer, disposed on the carrier, wherein the spacer is provided with a reflective layer covering a top surface of the spacer;
   at least one LED chip, disposed on the reflective layer and electrically connected to the carrier, wherein the LED chip has a first electrode and a second electrode both disposed on a top surface of the LED chip, while the first electrode and the second electrode are respectively electrically connected to the carrier via a first bonding wire and a second bonding wire;
   a junction coating, disposed over the spacer and covering the LED chip;
   a plurality of phosphor particles, distributed within the junction coating; and
   an encapsulant, disposed on the carrier and encapsulating the LED chip, the spacer and the junction coating.

2. The LED package structure according to claim 1, wherein the carrier comprises a metal leadframe, a pre-molded metal leadframe or a ceramic substrate.

3. The LED package structure according to claim 1, wherein the carrier has a cavity accommodating the spacer, the LED chip and the junction coating.

4. The LED package structure according to claim 3, wherein the cavity is filled with the encapsulant, while a top surface of the encapsulant is coplanar with a top surface of the carrier surrounding the cavity.

5. The LED package structure according to claim 1, wherein a profile of the encapsulant is in a convex lens shape.

6. The LED package structure according to claim 1, wherein the top surface of the spacer is fully covered by the reflective layer.

7. The LED package structure according to claim 1, wherein the top surface of the spacer is patterned or textured for enhancing light extraction efficiency of the LED package structure.

8. The LED package structure according to claim 1, wherein a top surface of the junction coating is patterned or textured for enhancing light extraction efficiency of the LED package structure.

9. The LED package structure according to claim 1, wherein the junction coating is made of transparent polymer or translucent polymer.

10. The LED package structure according to claim 1, wherein the junction coating is mixed with an organic filler or an inorganic filler.

11. The LED package structure according to claim 10, wherein a material of the filler within the junction coating is selected from a group consisting of SiO2, TiO2, Al2O3, Y2O3, carbon black, sintered diamond powder, asbestos, glass, and a combination thereof.

12. The LED package structure according to claim 1, wherein the encapsulant is made of transparent polymer or translucent polymer.

13. The LED package structure according to claim 1, wherein the encapsulant is mixed with an organic filler or an inorganic filler.

14. The LED package structure according to claim 13, wherein a material of the filler within the encapsulant is selected from a group consisting of SiO2, TiO2, Al2O3, Y2O3, carbon black, sintered diamond powder, asbestos, glass, and a combination thereof.

15. The LED package structure according to claim 1, wherein a size of the spacer ranges from 1.1 times the size of the LED chip to 3 times the size of the LED chip.

16. The LED package structure according to claim 1, wherein a material of the phosphor particles is elected from a group consisting of $(YGdTb)_3(AlGa)_5O_{12}$:Ce, $(SrBaCaMg)_2SiO_4$:Eu, $(Sr,Ba,CaMg)_3SiO_5$:Eu, $CaAlSiN_3$:Eu, $CaScO_4$:Ce, $Ca_{10}(PO_4)FCl$:SbMn, $M_5(PO_4)_3Cl$:Eu, $BaBg_2Al_{16}O_{27}$:Eu, Ba, $Mg_2Al_{16}O_{27}$:Eu, Mn, $3.5MgO.0.5MgF_2.GeO_2$:Mn, $Y_2O_2S$:Eu, $Mg_6As_2O_{11}$:Mn, $Sr_4Al_{14}O_{25}$:Eu, $(Zn, Cd)S$:Cu, $SrAl_2O_4$:Eu, $Ca_{10}(PO_4)_6ClBr$:Mn, Eu, $Zn_2GeO_4$:Mn, $Gd_2O_2S$:Eu, $La_2O_2S$:Eu, wherein M is an alkali earth metal selected from a group consisting of Sr, Ca, Ba, Mg, and a combination thereof.

17. A light emitting diode (LED) package structure, comprising:
    a carrier;
    a spacer, disposed on the carrier, wherein the spacer is provided with a reflective layer covering a top surface of the spacer, and the top surface of the spacer is patterned or textured for enhancing light extraction efficiency of the LED package structure;
    at least one LED chip, disposed on the reflective layer and electrically connected to the carrier;
    a junction coating, disposed over the spacer and covering the LED chip;
    a plurality of phosphor particles, distributed within the junction coating; and
    an encapsulant, disposed on the carrier and encapsulating the LED chip, the spacer and the junction coating.

18. The LED package structure according to claim 17, wherein the LED chip has a top electrode electrically connected to the carrier via a bonding wire and a bottom electrode electrically connected to the carrier via the spacer.

19. A light emitting diode (LED) package structure, comprising:
    a carrier;
    a spacer, disposed on the carrier, wherein the spacer is provided with a reflective layer covering a top surface of the spacer;
    at least one LED chip, disposed on the reflective layer and electrically connected to the carrier;
    a junction coating, disposed over the spacer and covering the LED chip, wherein a top surface of the junction coating is patterned or textured for enhancing light extraction efficiency of the LED package structure;
a plurality of phosphor particles, distributed within the junction coating; and
an encapsulant, disposed on the carrier and encapsulating the LED chip, the spacer and the junction coating.

20. The LED package structure according to claim 19, wherein the LED chip has a top electrode electrically connected to the carrier via a bonding wire and a bottom electrode electrically connected to the carrier via the spacer.

* * * * *